(12) United States Patent
Bauer et al.

(10) Patent No.: US 7,935,622 B2
(45) Date of Patent: May 3, 2011

(54) SUPPORT WITH SOLDER BALL ELEMENTS AND A METHOD FOR POPULATING SUBSTRATES WITH SOLDER BALLS

(75) Inventors: Michael Bauer, Nittendorf (DE); Thomas Bemmerl, Schwandorf (DE); Edward Fuergut, Dasing (DE); Simon Jerebic, Regensburg (DE); Herman Vilsmeier, Karlsfeld (DE)

(73) Assignee: Infineon Technologies AG, Neubiberg (DE)

( * ) Notice: Subject to any disclaimer, the term of this patent is extended or adjusted under 35 U.S.C. 154(b) by 595 days.

(21) Appl. No.: 10/565,259

(22) PCT Filed: May 17, 2005

(86) PCT No.: PCT/DE2005/000892
§ 371 (c)(1),
(2), (4) Date: Oct. 17, 2006

(87) PCT Pub. No.: WO2005/115072
PCT Pub. Date: Dec. 1, 2005

(65) Prior Publication Data
US 2007/0052112 A1    Mar. 8, 2007

(30) Foreign Application Priority Data
May 19, 2004 (DE) ............ 10 2004 025 279

(51) Int. Cl.
*H01L 21/44* (2006.01)
(52) U.S. Cl. ........ 438/612; 438/118; 257/E23.069; 257/783; 257/780

(58) Field of Classification Search .......... 438/612–617, 438/118; 257/777–786, E23.021, E23.069
See application file for complete search history.

(56) References Cited

U.S. PATENT DOCUMENTS

| | | | |
|---|---|---|---|
| 5,356,751 A | 10/1994 | Cairncross et al. | |
| 5,591,037 A * | 1/1997 | Jin et al. | 439/91 |
| 6,071,801 A | 6/2000 | Wachtler et al. | |
| 6,080,650 A | 6/2000 | Edwards | |
| 6,239,013 B1 | 5/2001 | Hotchkiss | |
| 6,284,568 B1 * | 9/2001 | Yamamoto | 438/108 |
| 6,303,407 B1 | 10/2001 | Hotchkiss et al. | |
| 6,432,744 B1 | 8/2002 | Amador et al. | |
| 2003/0148597 A1 * | 8/2003 | Tan et al. | 438/612 |

FOREIGN PATENT DOCUMENTS

| | | |
|---|---|---|
| EP | 0 840 368 | 5/1998 |
| EP | 0 955 676 | 11/1999 |
| JP | 7283521 | 10/1995 |
| JP | 8309522 | 11/1996 |
| JP | 10084178 | 3/1998 |
| JP | 10163271 | 6/1998 |
| WO | 99/40620 | 8/1999 |

* cited by examiner

*Primary Examiner* — Asok K Sarkar
*Assistant Examiner* — Julia Slutsker
(74) *Attorney, Agent, or Firm* — Dicke, Billig & Czaja, P.L.L.C.

(57) ABSTRACT

A support with solder ball elements for loading substrates with ball contacts is disclosed. One embodiment provides a system for loading substrates with ball contacts and a method for loading substrates with ball contacts. The support has a layer of adhesive applied on one side, the layer of adhesive losing its adhesive force to the greatest extent when irradiated. The support has solder ball elements, which are arranged closely packed in rows and columns on the layer of adhesive in a prescribed pitch for a semiconductor chip or a semiconductor component.

6 Claims, 5 Drawing Sheets

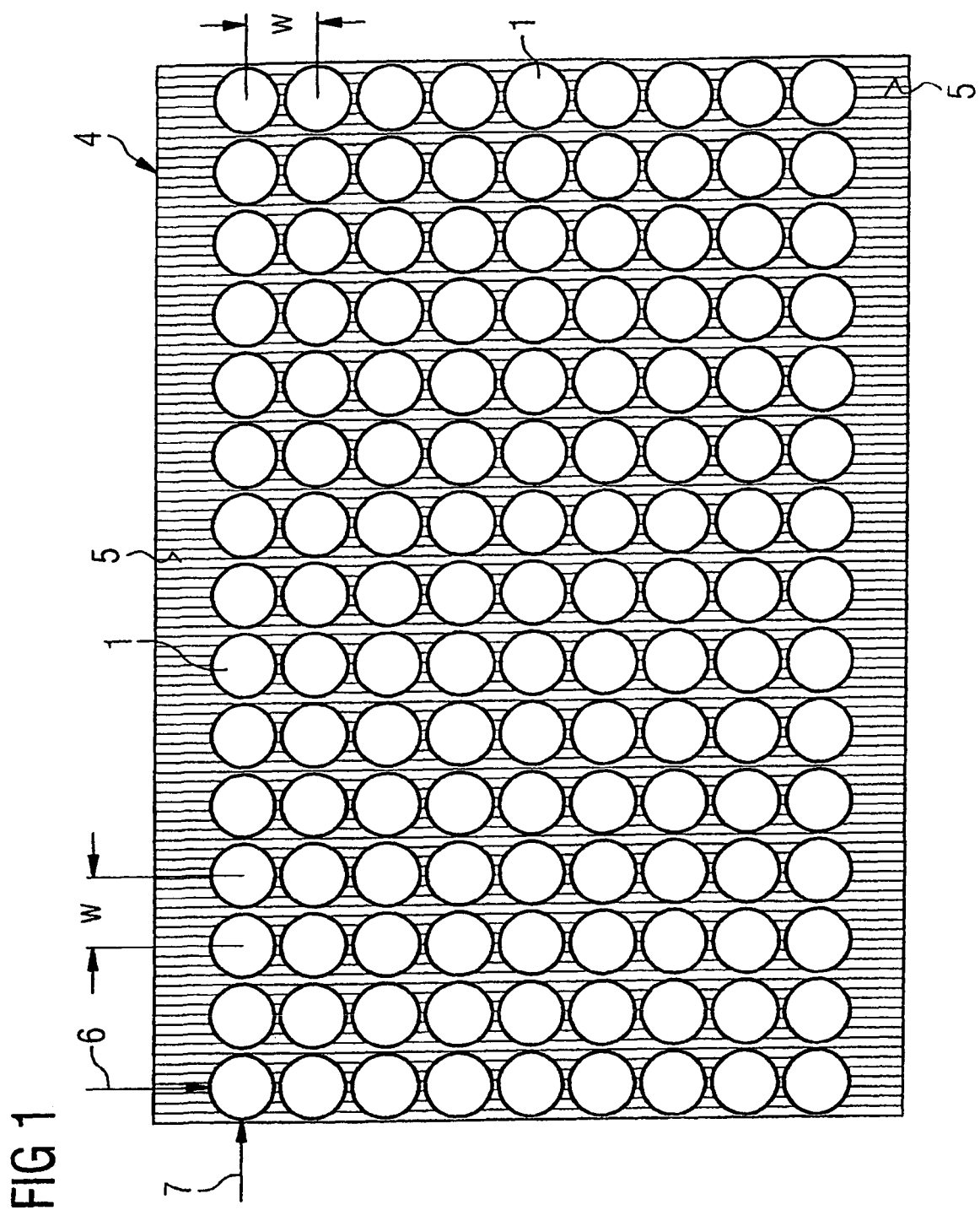

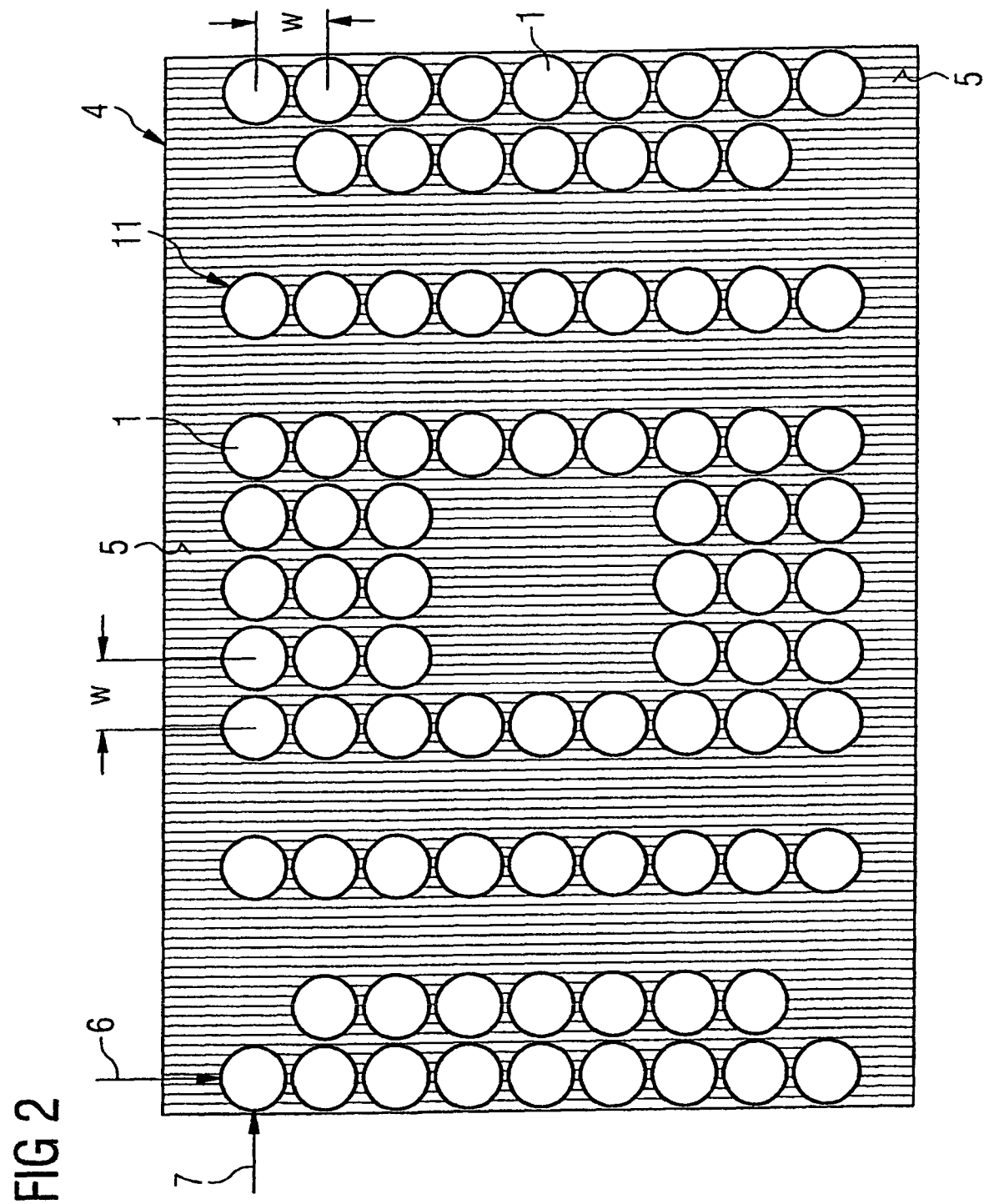

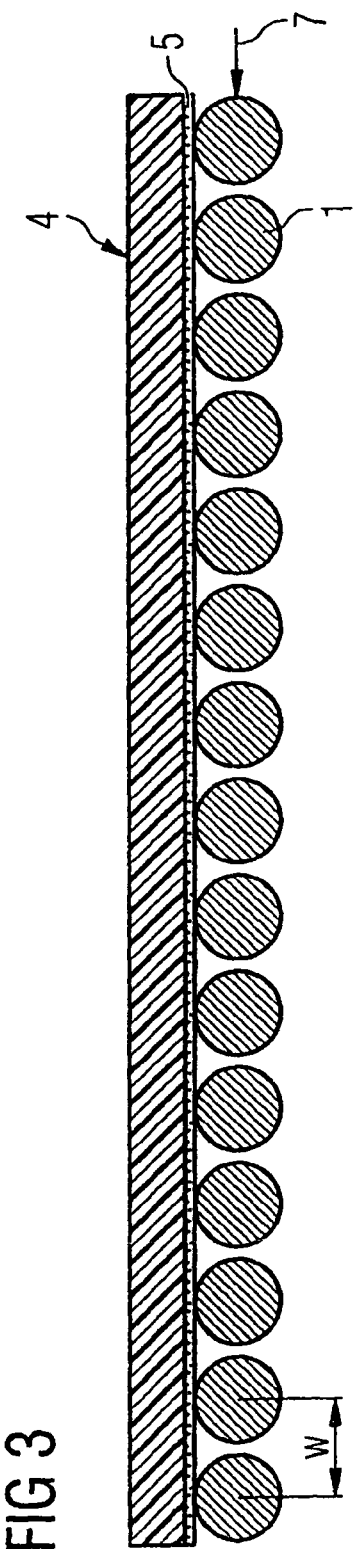
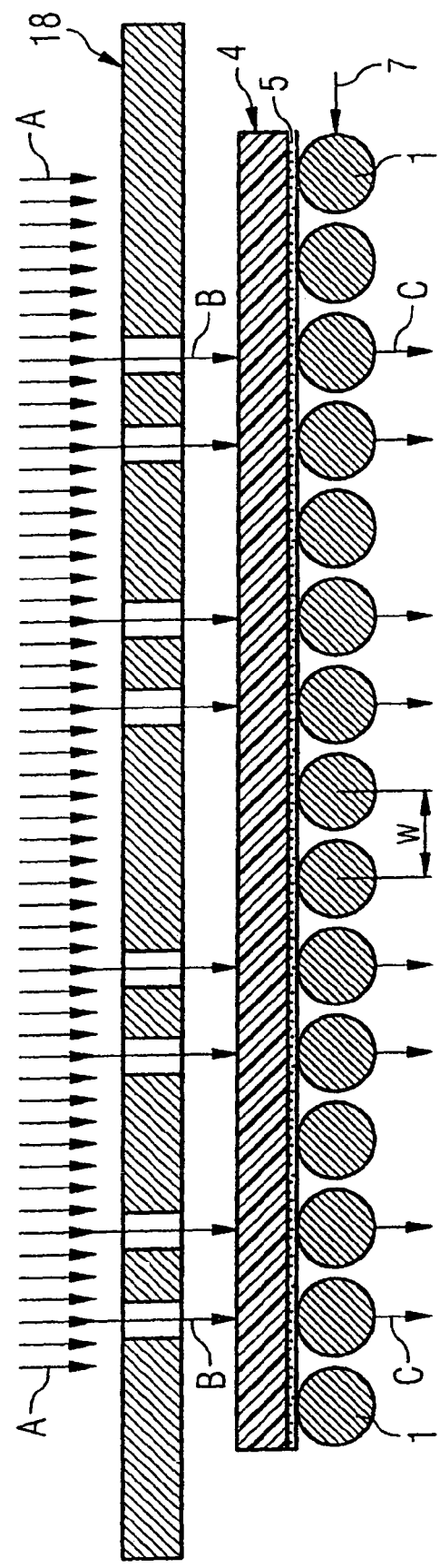

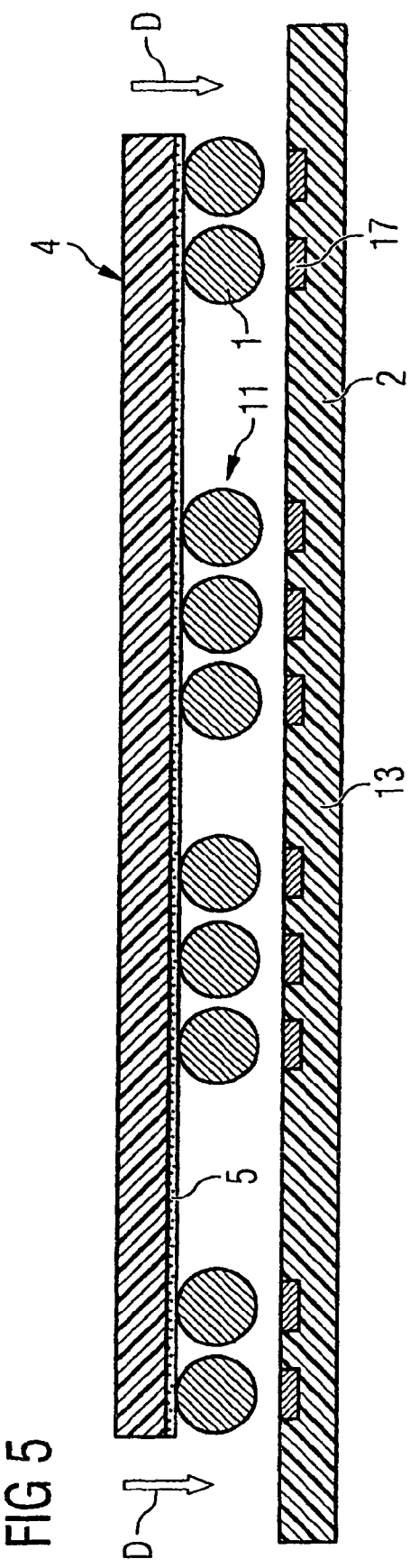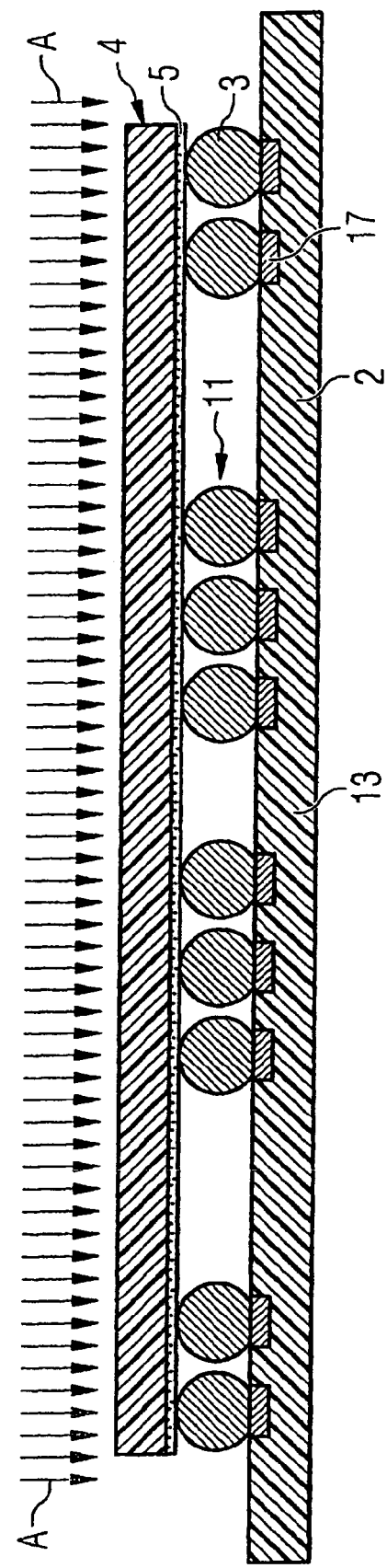

SUPPORT WITH SOLDER BALL ELEMENTS AND A METHOD FOR POPULATING SUBSTRATES WITH SOLDER BALLS

CROSS-REFERENCE TO RELATED APPLICATIONS

This Utility Patent Application claims priority to German Patent Application No. DE 10 2004 025 279.3, filed May 19, 2004, and PCT Patent Application No. PCT/DE2005/ 000892, filed May 17, 2006, both of which are incorporated herein by reference.

BACKGROUND

The invention provides a support with solder ball elements for loading substrates with ball contacts. In this connection, the expression substrate is understood as meaning the components in semiconductor manufacture to which solder ball elements are to be applied in a predetermined arrangement pattern, such as semiconductor wafers with many semiconductor chip positions, individual semiconductor chips, intermediate wiring boards of semiconductor stack components, wiring boards of individual semiconductor components and/ or printed circuit boards of a panel which may have a multiplicity of semiconductor component positions.

The term ball contacts is understood as meaning contacts such as extremely small flip-chip contacts with outer dimensions of a few micrometers through to contacts such as the intermediate contacts in semiconductor component stacks with outer dimensions in the millimeter range. While the flip-chip contacts are positioned on contact areas of, for example, 42×42 µm² (square micrometers) of a semiconductor wafer or a semiconductor chip, the intermediate contacts span the distance between the underside and the upper side of a semiconductor package in a semiconductor stack component and may reach outer dimensions of several millimeters. Between these two extreme outer dimensions lie the outer dimensions of the external contacts for semiconductor components with BGA (ball grid array) packages, which today are in widespread use.

Nevertheless, the loading of a substrate with ball contacts of this type is difficult, the degree of difficulty involved in specific mounting, and consequently the number of rejects, increasing as the dimensions become smaller, especially since the number of ball contacts to be applied also increases. The loading methods previously used are laborious and cost-intensive. A method of this type provides that the solder ball elements for ball contacts are shaken into depressions of a female mold and, as soon as all the depressions of a prescribed arrangement pattern are filled with solder ball elements, the solder ball elements in the depressions of the female mold can be connected to a corresponding pattern of contact areas on the substrate, for example by being simultaneously soldered on together. This technique is particularly problematical if an entire semiconductor wafer is to be provided with solder ball elements, especially since the number of solder ball elements to be applied simultaneously runs into the thousands.

For these and other reasons, there is a need for the present invention.

SUMMARY

The presend disclosure described a support with solder ball elements for loading substrates with ball contacts. One embodiment provides a system for loading substrates with ball contacts and a method for loading substrates with ball contacts. The support has a layer of adhesive applied on one side, the layer of adhesive losing its adhesive force to the greatest extent when irradiated. The support has solder ball elements, which are arranged closely packed in rows and columns on the layer of adhesive in a prescribed pitch for a semiconductor chip or a semiconductor component.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic view from below of a support with solder ball elements according to a first embodiment of the invention;

FIG. 2 illustrates a schematic view from below of a support with solder ball elements after patterning of the support of FIG. 1 to form an arrangement pattern of the solder ball elements;

FIG. 3 illustrates a schematic cross section of a support through a column of solder ball elements;

FIG. 4 illustrates a cross section of an arrangement for selectively irradiating the layer of adhesive of the support;

FIG. 5 illustrates a schematic cross section of an arrangement for selectively coating a wiring substrate with ball contacts;

FIG. 6 illustrates irradiation of the support over a large surface area for separating the support and the ball contact elements;

DETAILED DESCRIPTION

Figure 7:
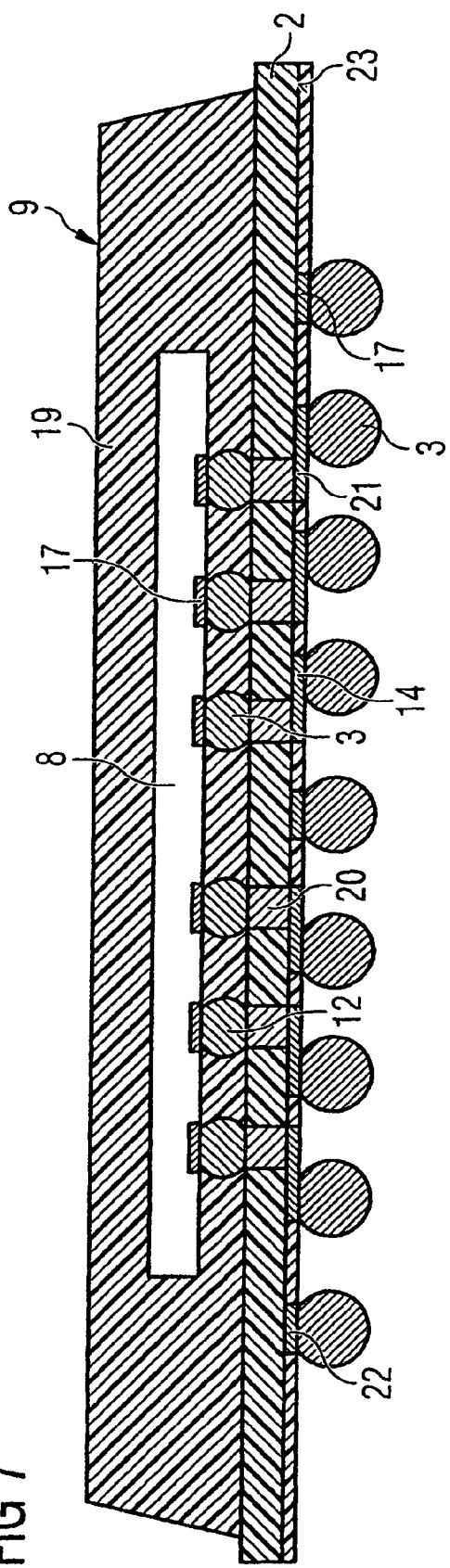
FIG. 7 illustrates a schematic cross section through a semiconductor component with a semiconductor chip using a flip-chip technique, both the flip chip contacts and the external contacts of the semiconductor component being positioned with the aid of supports according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a method for loading substrates with solder ball elements which overcomes the difficulties of the known methods, permits increased reliability of the loading of substrates with solder ball elements and provides a support with solder ball elements which makes a freely selectable arrangement pattern possible. By contrast with female molds with depressions, it is intended that the support with solder ball elements can be produced at low cost and permits a rapid design change to be made in the arrangement pattern for solder ball elements for different arrangement patterns of contact areas on substrates.

According to one embodiment of the invention, a support or carrier with solder ball elements for loading or populating substrates with ball contacts is provided. The support has a layer of adhesive applied on one side. The layer of adhesive includes a thermoplastic or thermosetting material, the adhesive force of which is reduced when irradiated. Furthermore, the support has solder ball elements which are arranged closely packed in rows and columns on the layer of adhesive. This close packing has the solder elements in the rows and columns in a prescribed minimally permissible pitch for a semiconductor chip or a semiconductor component.

One advantage of this support with solder ball elements is that it offers ball elements with the minimum permissible pitch for all the positions that are possible on a semiconductor chip or semiconductor component. Furthermore, it is an advantage of this support which has these closely packed solder ball elements that the adhesive force of the layer of adhesive is reduced when irradiated. Consequently, by selective irradiation of individual positions of solder ball elements, the solder ball element located there can be loosened at its position or even made to drop off. Even loosening of the solder ball elements is sufficient for the loosened solder ball elements to be removed from their positions by simple shaking or by other means of assistance, and to obtain with the remaining solder ball elements an arrangement pattern that has solder ball elements precisely where corresponding contact areas of a substrate are arranged. By keeping supports with rows and columns of closely packed solder ball elements, but with different minimal pitches, a supply of supports for a wide variety of types of application can be kept.

In one form of the support, it is adapted to a substrate to be loaded in the form of a semiconductor wafer. In this case, the support has an arrangement pattern for flip-chip contacts for a multiplicity of semiconductor chips on the semiconductor wafer. In all the solder ball positions of the support provided for it, those solder ball elements for which no contact area is provided on the semiconductor wafer are loosened and removed by irradiating the layer of adhesive.

In a further embodiment of the invention, the support is adapted to the arrangement pattern for flip-chip contacts of a semiconductor chip, so that semiconductor chips can be provided with flip-chip contacts in an efficient way. Here again, it is possible to use a then standardized support with a standardized pitch for the solder ball elements, which can be modified according to requirements to ball contacts for the semiconductor chip by irradiating individual solder ball element positions.

In the case of a further embodiment of the invention, it is provided that the printed circuit board of a panel is provided as the substrate to be loaded. For this purpose, the support has an arrangement pattern for ball contacts of a multiplicity of semiconductor components of the panel. This embodiment has the advantage that all the required external contacts of the semiconductor components for a panel can be applied to the panel simultaneously and together by one method step.

Furthermore, it is provided that the substrate to be loaded is a wiring support of a semiconductor component. In this case, the support has an arrangement pattern for external contacts of a semiconductor component. External contacts of this type of a semiconductor component are larger than flip-chip contacts of a semiconductor chip. Accordingly, the minimum pitch in which the solder ball elements are arranged on the support is also greater.

Finally, it is envisaged to provide an intermediate wiring board with appropriate stack contacts as the substrate to be loaded. Stack contacts of this type have outer dimensions which correspond to the thickness of one of the semiconductor components to be stacked and respectively make a metallic external contact area available on the upper side and the underside of a semiconductor component, so that a via hole through the semiconductor stack from top to bottom or from bottom to top becomes possible by way of the stack contacts. For this purpose, the stack contacts have outer dimensions which are greater than the thickness of a semiconductor chip and may reach the outer dimensions of a thickness of a semiconductor component.

A further aspect of the invention concerns a system for loading substrates with ball contacts. This system has a support with a layer of adhesive on one side, the layer of adhesive being a thermoplastic or thermosetting material, the adhesive force of which is reduced when irradiated. Furthermore, the system has ball elements which are arranged closely packed in rows and columns on the layer of adhesive in prescribed minimally permissible pitches for a semiconductor chip or a semiconductor component.

Apart from the support with the solder ball elements, the system has an irradiating device with a source of radiation. Finally, the system has a removal device for removing the loosened solder ball elements while leaving solder ball elements in an arrangement pattern for flip-chip contacts or ball contacts. This removal device for removing the loosened solder ball elements may be formed in various ways, as described in more detail below.

Apart from the removal device for removing loosened solder ball elements, the system includes a loading device for fixing the solder ball elements remaining in a predetermined arrangement pattern on the support on corresponding contact areas of the semiconductor wafer or of the semiconductor chip or of a wiring support for a semiconductor component. In addition, the system has a pulling-off device for pulling the support off the ball contacts as soon as the latter are connected to the contact areas of the substrates in the loading device.

This system has the advantage that it only has to have few components to accomplish relatively complex contact arrangement patterns on corresponding substrates. In addition, the system has the advantage that it can be made available at extremely low cost. And finally, the system has the advantage that it can also be divided into subgroups, one of the subgroups merely producing the standard supports with closely packed solder ball elements. Another component undertakes the patterning to form an arrangement pattern, and only in a further component is the substrate brought together with the support for loading with solder ball elements.

In one embodiment of the invention, the irradiating device has a laser beam source. With the aid of corresponding deflecting devices, the laser beam source can perform selective irradiation of the support at intended positions by scanning of the laser beam. A method variant of this type has the advantage that no masks have to be provided for selective irradiation of the support, but it is merely necessary instead for the scanning of the laser to be correspondingly programmed. Consequently, the solder ball elements of the support are loosened at all the exposed positions and irradiation by the laser is suppressed at the positions at which the solder ball elements are required for an arrangement pattern of ball contacts on corresponding substrates.

In the case of a further embodiment of the system, the irradiating device has a UV source. This UV source irradiates the support over a surface area, so that the system additionally has a mask holder, which is provided between the UV source and the support for selective irradiation of the support at intended positions. This mask holder has masks which allow UV rays onto the support, and consequently onto the layer of adhesive, only at the positions at which solder ball elements are to be loosened or removed.

Furthermore, it is provided that the system has a removal device for removing the loosened solder ball elements, which in one embodiment of the invention has a roller or a continuous tape. This roller or this continuous tape is provided with a tacky surface, so that the loosened solder ball elements to be removed remain adhesively attached on the tacky surface. This removal device has the advantage that the solder ball elements loosened by irradiation of the adhesive location can be removed relatively gently and reliably transported away, since they remain attached on the tacky surfaces of the continuous tape or the roller.

In a further embodiment of the system, it is provided that the removal device for removing the loosened solder ball elements has a roller or a continuous tape on the upper sides of which stripping bristles are provided. With stripping bristles of this type, the loosened solder ball elements are indeed removed, but it may happen that during the stripping operation solder balls can get into the system and hinder operation. In this respect, the removal device additionally has a container surrounding the stripping device, which catches and collects all the solder ball elements detached by the stripping bristles. The balls that are caught can then be used again for loading a support with a closely packed arrangement of solder ball elements.

Apart from a possible holder for masks and holders for the removal device and irradiating device, the loading device additionally has a holder for the substrates to be loaded. In addition, the system has a support holder for the support with an arrangement pattern of solder ball elements. Both are aligned in the loading device with the aid of adjusting means in such a way that the remaining solder ball elements of the support in the support holder can be aligned with contact areas of the substrates to be loaded in the substrate holder. Only after alignment of the support and substrate are the two brought together and can the solder ball elements be soldered onto the substrate at intended and aligned positions in a thermal step.

A method for loading substrates with ball contacts has the following method steps. Firstly, a tape with a layer of adhesive on one side, which includes a thermoplastic or thermosetting material, the adhesive force of which is reduced when irradiated, is produced from a support material. Subsequently, solder ball elements are arranged on this tape, on the layer of adhesive, in rows and columns in a prescribed minimally permissible pitch for a semiconductor chip or for a semiconductor component.

This support tape, closely packed with solder ball elements, is subsequently selectively irradiated to reduce the adhesion of the layer of adhesive and to loosen solder ball elements at intended positions. Subsequently, the loosened solder ball elements are removed while leaving solder ball elements fixed on the support in an arrangement pattern for a semiconductor chip or for a semiconductor component. After an adjustment of the support prepared in this way, with solder ball elements at predetermined positions, the support is aligned with respect to a substrate with contact areas for applying solder ball elements and soldering them on to form ball contacts. This is followed by soldering the solder ball elements remaining in a prescribed arrangement pattern on the support onto contact areas of a semiconductor wafer or semiconductor chip or onto a wiring support for semiconductor components. In this way it is also possible for large-volume solder ball elements for intermediate contacts of a semiconductor stack component to be prepared and soldered on at the corresponding positions.

After the soldering-on, the pulling-off of the support from the substrate loaded with flip-chip contacts or with ball contacts is performed. This may be assisted by the entire surface area of the support being irradiated, for example by a UV source. However, pulling-off of the support while the substrate is being heated is also possible.

For applying the layer of adhesive to the support material, a spraying process may be provided. It is also possible for the layer of adhesive to be rolled onto a support material.

The solder ball contact elements may be adhesively attached onto the layer of adhesive in rows, from dispensing nozzles arranged in parallel next to one another, in a prescribed minimally permissible pitch for a semiconductor chip or a semiconductor component. Dispensing nozzles of this type may take the form of pipettes, in the capillaries of which the solder ball elements are stacked. To reduce the adhesion of the layer of adhesive, UV rays or laser beams may be selectively made to act on the support and/or the layer of adhesive at the prescribed positions, so that only solder ball elements that do not match the arrangement pattern of the contact areas on a substrate are removed.

As already mentioned above, the lifting-off of the support material from the soldered-on ball contacts may be carried out by irradiating the support material over a large surface area.

To sum up, it can be stated that, with the support according to the invention, the "ball apply process" or the "bumping method" can be made significantly easier by the use of the support according to the invention, since it is no longer necessary for a "tool" to be made specifically for each "bailout". Consequently, the process times are also reduced, in particular in the case of "wafer bumping" or "wafer ball apply".

By applying solder ball elements or "balls" to the full surface area of a layer of adhesive of a support which is of such a nature that, under the influence of appropriate heat and/or radiation, it loses the adhesive force at the irradiated areas, it is possible to accomplish prescribed arrangement patterns for the ball contacts of semiconductor chips, semiconductor wafers, semiconductor components or else of stacked components in a precise and simple manner. In principle, all the desired "bailouts" can be accomplished. A flux possibly required for the soldering-on may be applied directly to the remaining "balls/bumps". Alternatively, the flux coating may also be applied to the contact areas or "bond pads". Consequently, the support according to the invention and the system according to the invention for loading the support and the method for loading substrates with ball contacts, the "balls", produce the following advantages:

1. universally usable support for all ball sizes;
2. universal replication of various contact ball pitches, which can also be combined on a single support;
3. use of continuous tapes is possible,
4. use of films is possible;
5. in principle, any arrangement pattern or any "ballout" can be accomplished;

6. very great accuracy can be accomplished by the possibility of photolithographic processes, for example with selective irradiation;

7. in the case of large surface areas, such as surfaces of semiconductor wafers, loading with ball contacts, known as "balling", is possible by a single process step;

8. flux can be applied directly to the solder ball elements of the support, without an additional tool being necessary.

FIG. 1 illustrates a schematic view from below of a support 4 with solder ball elements 1 according to a first embodiment of the invention. On its underside, the support 4 has a layer of adhesive 5, which has reduced adhesion for the solder ball elements 1 arranged on the layer of adhesive 5 when it is exposed to the effect of irradiation or heat. The solder ball elements 1 are arranged on the layer of adhesive 5 of the support 4 in rows 6 and columns 7 in a pitch w both in the direction of the rows 6 and in the direction of the columns 7. The support 4 is formed as a continuous tape, the portion of the continuous tape illustrated in FIG. 1 having been chosen to match a substrate on the contact areas of which solder ball elements are to be soldered on at predetermined positions 1 to form ball contacts.

A support 4 of this type may be produced by firstly a support material being provided with the layer of adhesive 5 of a thermosetting or thermoplastic material and the solder ball elements 1 fixed on the layer of adhesive 5 row by row from a pipette assembly. A pipette assembly of this type can supply the solder ball elements 1 of a row 6 at the correct time via the cannulas of the pipettes. It is also possible by means of a vacuum pipette assembly to hold the solder ball elements 1 of a row 6 respectively at the mouthpieces of the vacuum pipettes until they are fixed on the layer of adhesive 5 of the support 4.

FIG. 2 illustrates a schematic view from below of a support 4 with solder ball elements 1 after patterning of the support 4 of FIG. 1 to form an arrangement pattern 11 of the solder ball elements 1. This arrangement pattern 11 corresponds to a contact area pattern of a substrate which is to be loaded with the solder ball elements 1 illustrated in FIG. 2. For this purpose, the solder ball elements 1 of this arrangement pattern 11 may firstly be brought into contact with a flux, which is applied to the solder ball elements 1 for example by a die or by a roller.

With the figures which follow, it is explained how an arrangement pattern 11 of this type can be produced and how this patterning of solder ball elements is subsequently soldered onto contact areas of a substrate to form ball contacts. The designations illustrated in FIG. 2 and the figures which follow are no longer explained if the components of these designations perform the same functions as in FIG. 1.

FIG. 3 illustrates a schematic cross section of a support 4 through a column 7 of solder ball elements 1. In the case of this support 4, each possible position is occupied by a solder ball element 1 in a pitch w, so that the column 7 is initially completely occupied with solder ball elements 1, the layer of adhesive 5 ensuring that the solder ball elements 1 are fixed in their position.

FIG. 4 illustrates a cross section of an arrangement for selective irradiation of a layer of adhesive 5 of the support 4. In this case, the irradiation is performed by a large-area source of UV radiation, which irradiates in directions of arrows A a mask 18 of a system for loading substrates with ball contacts. This mask 18 irradiates in the direction of arrow B only the positions of the solder ball elements 1 of the support 4 that are to be removed from the support 4 in the direction of arrow C. The other solder ball elements 1 are protected by the mask 18 from being irradiated with UV light. Consequently, after the end of this process, the solder ball elements in a position not affected by the UV rays A remain on the adhesive layer 5. A mask 18 of this type can be prepared in a precise manner with the aid of photolithography, so that an exact arrangement pattern of solder ball elements 1 on the support 4 remains after this step.

FIG. 5 illustrates a schematic cross section of an arrangement for selectively irradiating a wiring substrate 2 with ball contacts. For this purpose, the arrangement pattern 11 of solder ball elements 1 of the support 4 is aligned with respect to the wiring substrate 2 until the solder ball elements 1 lie opposite the contact areas 17 of the wiring substrate 2. Then the support 4 with its arrangement pattern 11 of solder ball elements 1 is brought onto the wiring substrate 2 in the direction of arrow D and a soldering-on of the solder ball elements 1 is carried out in a soldering process to form contact balls on the wiring substrate 2 in the positions of the contact areas 17. The support 4 with its layer of adhesive 5 is then still present on the ball contacts and, as FIG. 6 illustrates, must be removed.

FIG. 6 illustrates a large-area irradiation of the support 4 for separating the support 4 and the ball contacts 3 of the wiring substrate 2. Components with the same functions as in the previous figures are identified by the same designations and are not separately explained. The large-area irradiation, for example with a UV source, is again illustrated by the arrows A, this time no mask being required, especially since all the remaining, still not irradiated positions of the layer of adhesive 5 are to be detached from the original solder ball elements.

FIG. 7 illustrates a schematic cross section through a semiconductor component 9 with a semiconductor chip 8 using a flip-chip technique, both the flip-chip contacts 12 of the semiconductor chip 8 and the external contacts 14 of the semiconductor component 9 having been positioned with the aid of supports 4 according to the invention. The representation in FIG. 7 is not true to scale, especially since the external contacts 14 on the underside 23 of the wiring substrate 2 have outer dimensions that are larger, for instance by an order of magnitude, than the flip-chip contacts 12 on the contact areas 17 of the semiconductor chip 8. In this embodiment of the invention, the semiconductor chip 8, with its flip-chip contacts 12, is surrounded by a polymer composition 19, which at the same time forms an upper part of the package of the semiconductor component 9.

The underside of the package is substantially formed by the wiring substrate 2, on which the external contacts 14 are arranged outward in a uniformly distributed manner, while the flip-chip contacts 12 are disposed on the basis of the position of the contact areas 17 of the semiconductor chip 8. In order nevertheless to connect the flip-chip contacts 12 electrically to the external contacts 14, the wiring substrate 2 has contact vias 20, which extend through the wiring substrate 2 and are connected by means of a wiring pattering 21 to external contact areas 22 on the underside 23 of the wiring substrate 2. The external contacts 14 are arranged on these external contact areas 22 by the technique described above with the aid of a support.

Figure 8:
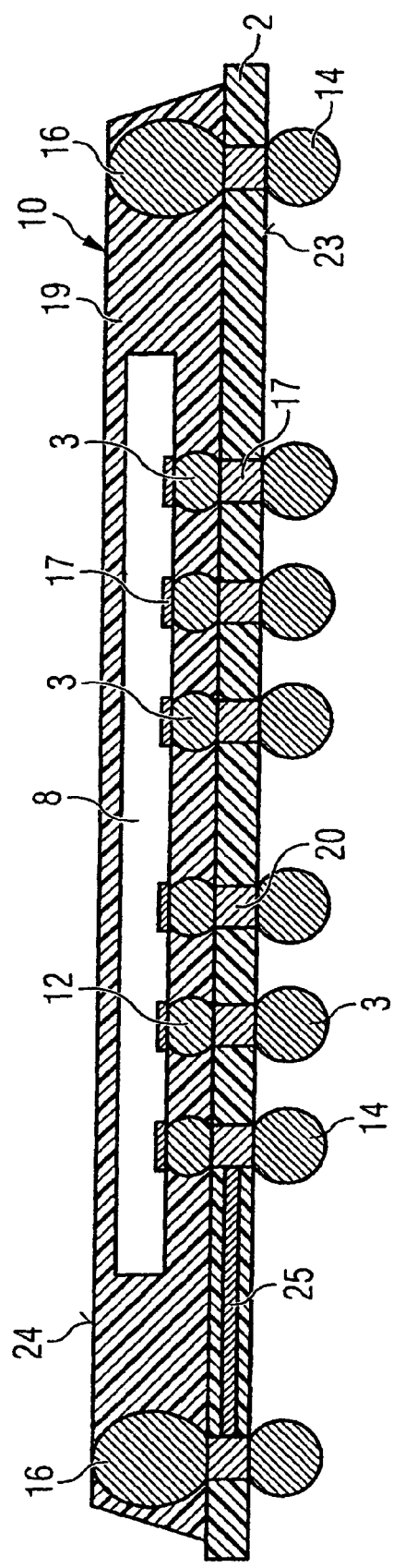
FIG. 8 illustrates a schematic cross section through a semiconductor stack component with stack contacts, which permit the connection between the underside and upper side of the semiconductor stack component of the stack.

FIG. 8 illustrates a schematic cross section through a semiconductor stack component 10 with stack contacts 16, which permit the connection between the underside 23 and the upper side 24 of a semiconductor stack component 10. The embodiment according to FIG. 8 differs from the previous embodiments in that three completely different solder ball sizes are processed for the production of this semiconductor component 10, and accordingly three differently patterned supports with solder ball elements are also made available for the manufacture of this semiconductor component 10.

In the case of the stack contacts 16, the main concern is that the entire polymer composition 19 that forms the upper part of the package of the semiconductor stack component 10 is penetrated by the stack contacts 16. For this purpose, they are arranged in edge regions of the wiring substrate 2 around the semiconductor chip 8. Corresponding redistribution routing lines 25 ensure that the external contacts 14 and the stack contacts 16 are electrically connected to one another. By means of the contact vias 20, the flip-chip contacts 12 of the semiconductor chip 8 are additionally connected to the external contacts 14. It is consequently possible to arrange a multiplicity of the semiconductor stack components 10 one on top of the other and to connect them by means of the stack contacts 16 to the external contacts 14 of the semiconductor component stack 10.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for loading substrates with solder ball contacts, comprising:
   producing a tape from support material with a layer of adhesive on one side, comprising a thermoplastic or thermosetting material, the adhesive force of which is reduced when irradiated;
   attaching solder ball elements to the support material by arranging the solder ball elements in rows and columns on the layer of adhesive in a prescribed minimally permissible pitch for a semiconductor chip or for a semiconductor component;
   loosening solder ball elements at prescribed first positions by selectively irradiating the support such that the prescribed first positions receive radiation and second positions do not receive radiation to reduce the adhesion of the layer of adhesive at only the prescribed first positions;
   removing the loosened solder ball elements and leaving solder ball elements that are fixed on the support material in an arrangement pattern for a semiconductor chip or for a semiconductor component;
   soldering the solder ball elements remaining in a predetermined arrangement pattern on the support onto contact areas of a semiconductor wafer or semiconductor chip or wiring support for semiconductor components; and
   pulling the support off the substrate to be loaded with flip-chip contacts or ball contacts.

2. The method according to claim 1, comprising spraying the support on one side with a layer of adhesive.

3. The method according to claim 1, comprising adhesively attaching the solder ball elements onto the layer of adhesive in rows, from dispensing nozzles arranged in parallel next to one another, in a prescribed minimally permissible pitch for a semiconductor chip or a semiconductor component.

4. The method according to claim 1, comprising wherein a laser beam for selectively irradiating the support to reduce the adhesion of the layer of adhesive and to loosen solder ball elements at prescribed positions is passed over the support.

5. The method according to claim 1, comprising wherein the support is selectively irradiated with UV rays through a mask to reduce the adhesion of the layer of adhesive and to loosen solder ball elements at prescribed positions.

6. The method according to claim 1, comprising subjecting the support to irradiation over a large surface area, and the support is pulled off the ball contacts.

\* \* \* \* \*